United States Patent [19]
Carbonaro et al.

[11] Patent Number: 6,099,650
[45] Date of Patent: Aug. 8, 2000

[54] STRUCTURE AND METHOD FOR REDUCING SLIP IN SEMICONDUCTOR WAFERS

[75] Inventors: Alan Carbonaro, Livermore; Glenn Pfefferkorn, Fremont; Gary L. Evans, Pleasanton, all of Calif.

[73] Assignee: Concept Systems Design, Inc., Fremont, Calif.

[21] Appl. No.: 09/034,545

[22] Filed: Mar. 3, 1998

[51] Int. Cl.[7] .................................................. C23C 16/00
[52] U.S. Cl. ........................ 118/715; 118/725; 156/345; 117/200; 427/248.1
[58] Field of Search .................................. 118/715, 725; 427/248.1; 117/200; 156/345

[56] References Cited

U.S. PATENT DOCUMENTS 4,579,080  4/1986  Martin et al. .............................. 118/500
5,685,906  11/1997  Dietze et al. ............................. 117/101

*Primary Examiner*—Shrive Beck
*Assistant Examiner*—Norca L. Torres-Velazquez
*Attorney, Agent, or Firm*—Skjerven, Morrill, MacPherson, Franklin, & Friel, LLP.; Tom Chen

[57] ABSTRACT

A semiconductor chemical vapor deposition reactor includes a susceptor and a cover above the susceptor to reflect and radiate heat from the susceptor back onto the top surfaces of the wafers held on the susceptor, thereby minimizing temperature gradients on the wafers and reducing slip. The cover has an opening in the center through which process gases are injected, creating a Bernouli effect to draw the process gases between the cover and susceptor, where the process gases then deposit on the wafers secured thereon.

16 Claims, 2 Drawing Sheets

STRUCTURE AND METHOD FOR REDUCING SLIP IN SEMICONDUCTOR WAFERS

BACKGROUND

1. Field of the Invention

This invention relates to chemical vapor deposition reactors for the growth of epitaxial layers and in particular to such reactors which reduce slip.

2. Description of Related Art

One of the problems associated with growing epitaxial films using prior art chemical vapor deposition (CVD) reactors is that wafers formed in such reactors often have defects known as slip. Slip is a dislocation of molecules along crystallographic planes formed when parts of a single crystal move relative to each other along these planes. This movement usually occurs when the wafer is unevenly heated or cooled during the deposition process, particularly between the top and bottom surfaces of the wafer and at the outer edges where heat is dissipated quicker. Thermal stress is then produced at portions of the wafer where large temperature gradients exist, causing slip when parts of the crystal move to relieve such stress. Wafers having slip defects can lead to undesirable yield loss when used to fabricate semiconductor devices.

In an attempt to eliminate slip, McNeilly et al. propose a method and apparatus in U.S. Pat. No. 4,496,609, entitled "Chemical Vapor Deposition Coating Process Employing Radiant Heat and a Susceptor", for using light sources placed outside the reactor to uniformly heat wafers mounted on a susceptor. Radiant energy from the light sources or lamps passes through the reactor walls, but is absorbed by the susceptor and/or wafers, thereby heating the wafers while keeping the walls cool. Because heat loss is greatest at the outer edges, the susceptor, which also serves as a heat sink, helps minimize temperature gradients at the outer edges, thereby increasing the temperature uniformity along the bottom of the wafers.

However, even with lamps carefully placed and controlled, it is difficult to maintain temperature uniformity on the wafers, especially along the tops of the wafers. As a result, slip defects may still occur on wafers subjected to epitaxial growth using the process and apparatus disclosed in McNeilly et al.

Accordingly, it is desired to have a structure and method which reduces slip during the manufacture of wafers in a CVD reactor.

SUMMARY

In accordance with this invention, wafers are placed on a susceptor, and a structure (sometimes called a "cover") is placed above the wafers to serve as a heat barrier to radiate and/or reflect heat from the susceptor onto the wafers. By preventing heat from being radiated from the wafers, the temperature gradient across the wafers is substantially reduced, thereby substantially reducing or eliminating slip in the wafers during and after the formation of epitaxial layers. In addition, because the cover contributes to the heating of the wafers, a lower amount of RF energy is needed during the epitaxial growth process.

In accordance with one embodiment of this invention, the cover, made of graphite with a silicon carbide coating, is approximately ¼" to 1" thick and has approximately the same shape and diameter as the susceptor. Varying the cover thickness varies the amount of heat radiated from the cover to the wafers below. The cover is placed approximately ¼" to 2" above the wafers, which are mounted on a susceptor. This distance can be adjusted to control the amount of heat reflected back onto the wafers. As a result, heating on the top of the wafers is increased. In other embodiments, heat sources can be used to actively heat the cover to more closely approximate a black body cavity bounded by the wafers and the cover.

The space between the wafers and cover also acts as a channel for process gases to enter and deposit on the wafers as they move across the surfaces of the wafers. The process gases are drawn from the outer circumference of the reactor toward the center of the reactor through this channel due to the Bernouli effect. A venturi injects process gases vertically into a bell-shaped or other suitable shaped reactor chamber through an opening in the center of the cover. As the process gases are injected into the reactor chamber, a Bernouli effect is created and a pressure gradient is formed from the outer circumference to the center of the susceptor along this channel. Process gases are thus drawn into the channel and deposit onto the wafers as the gases move parallel to the wafers and back out through the cover opening. Thus by using the well-known Bernouli effect for this purpose, the flow rate of the gases across the wafers can be better controlled. In this embodiment, the gases are removed from the reactor typically through exit ports formed, for example, in the bottom surface of the reactor under the susceptor.

Among the advantages of this invention are a substantial reduction in RF power required to heat the wafers (experiments show a reduction in power from 10% to 30% when compared to using reactors without the cover), greater uniformity of thickness of the grown epitaxial layers among the simultaneously processed wafers, and a substantial reduction in slip in the wafers.

This invention will be more fully understood in light of the following detailed description taken together with the drawings.

BRIEF DESCRIPTION OF THE DRAWINGS

Use of the same reference numbers in different figures indicates the same or similar elements.

DETAILED DESCRIPTION

Figure 1:
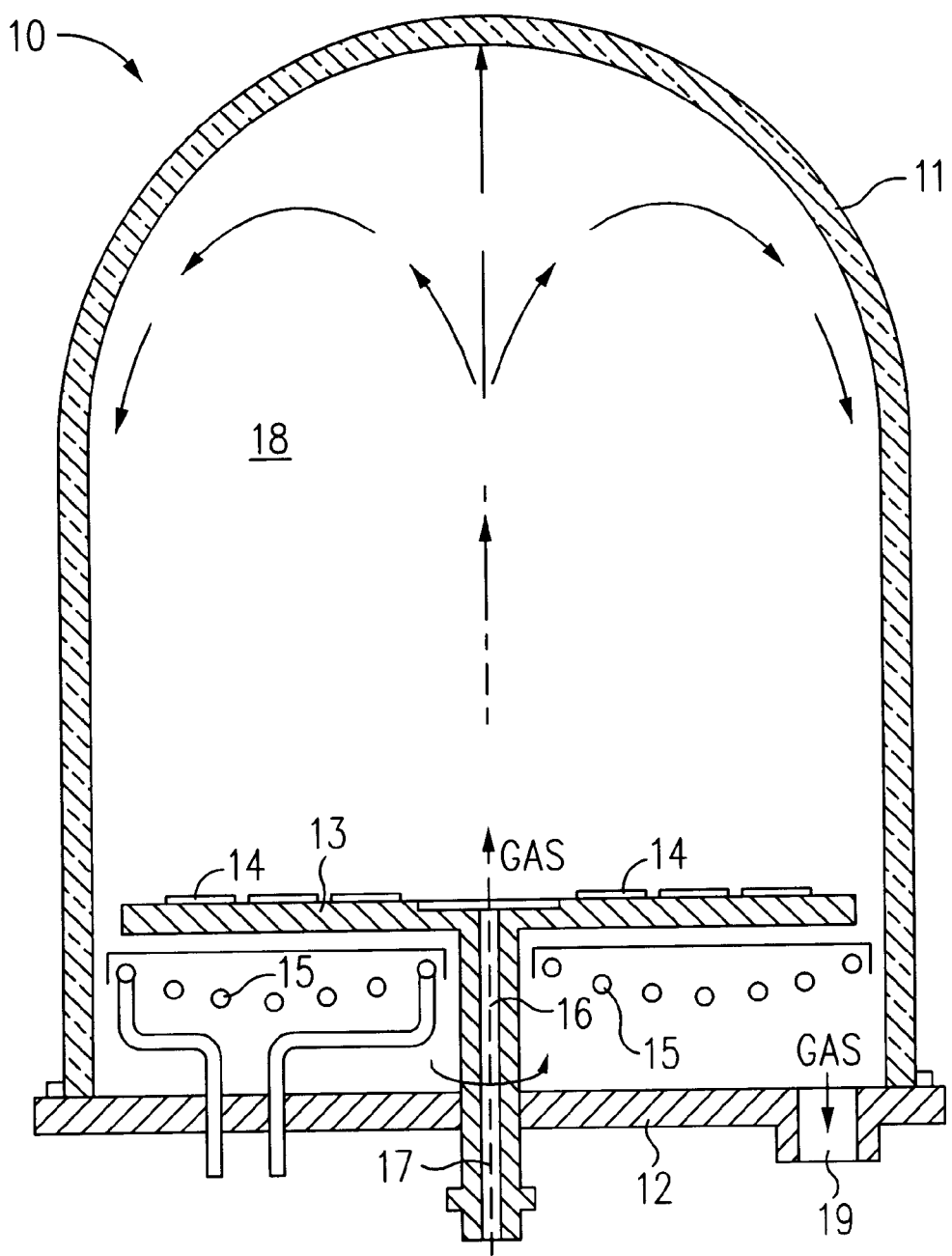
FIG. 1 is a sectional view of a bell jar reactor of the prior art.

FIG. 1 shows a reactor of a type common in the prior art suitable for use with this invention. This reactor is a type described, for example, in U.S. Pat. No. 4,632,058 to Dixon et al., entitled "Apparatus for Uniform Chemical Vapor Deposition". FIG. 1 shows a reactor 10, where a bell jar 11 and a base plate 12 enclose a susceptor 13, on which is placed a plurality of wafers 14 for the deposition of an epitaxial layer thereon. A heating source 15, such as a heating coil or an RF energy source, heats susceptor 13, which in turn heats wafers 14 to a process temperature, typically in the range of 1050° C. to 1250° C. One of several silicon-containing epitaxy gases, such as dichlorosilane ($SiH_2Cl_2$), trichlorosilane ($SiHCl_3$), silicon tetrachloride ($SiCl_4$), or silane ($SiH_4$), along with a hydrogen carrier gas are then injected into reactor chamber 18 via a tube 16 located within center axis 17. An epitaxial layer is formed as the process gases are deposited on wafers 14, which, along with susceptor 13, are rotated about center axis 17. Process gases are then removed from reactor chamber 18 by being drawn around the outside circumference of susceptor 13 down through to an exit port 19.

Wafers 14 on susceptor 13 have their top surfaces exposed to the area within bell jar 11. As the bottom surfaces of wafers 14 are heated, energy in wafers 14 radiates through the top surfaces of the wafers to the gases in reactor chamber 18 and to the walls of reactor 10. This leads to a temperature difference between the top and bottom surfaces of wafers 14, resulting in differing amounts of thermal expansion associated therewith. Because the temperatures at the bottom surfaces are higher than at the top surfaces, the bottoms surfaces of wafers 14 expand more than the top surfaces, causing the wafers to bow and the outer edges to lift from the susceptor. The wafers continue to bow as more heat is dissipated from and less energy is transferred to the outer edges of the wafers by the susceptor. At a point where the stress caused by the bowing exceeds the yield strength of the silicon, slip defects form on the wafer structure.

Figure 2:
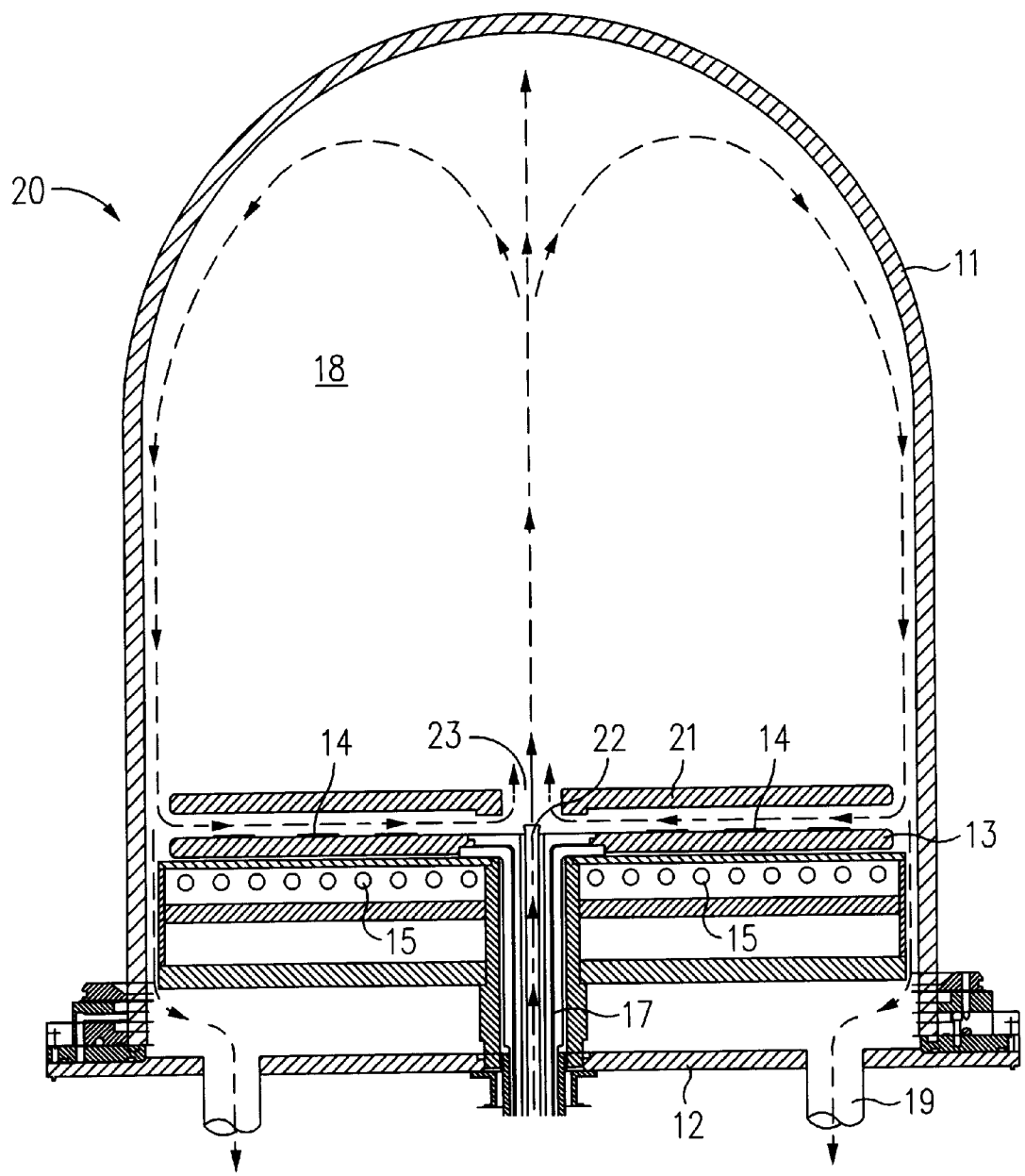
FIG. 2 is a sectional view of a reactor in accordance with one embodiment of the present invention.

FIG. 2 shows a reactor 20 according to one embodiment of the present invention in which the bowing of the wafer, and thus slip, is substantially reduced by the use of a cover 21. Cover 21 is added to a reactor similar to that of FIG. 1. Cover 21, preferably formed of silicon carbide, quartz, or graphite covered by silicon carbide to seal the graphite, is placed on support pins (not shown for simplicity) mounted on the interior of bell jar 11. Pins attached to bell jar 11 allow cover 21 to be removed with bell jar 11 for easier access to the underlying wafers 14, i.e., for removal and cleaning. A plurality of pins, typically three, are placed such that cover 21 is held in a plane ranging from approximately ¼" to 2" above the surfaces of wafers 14. In other embodiments, any other suitable support, such as quartz blocks, can be used to separate cover 21 from wafers 14.

When the wafers are of silicon, a silicon-containing gas, such as $SiH_2Cl_2$, $SiHCl_3$, $SiCl_4$, or $SiH_4$, along with a hydrogen carrier gas are injected into reactor chamber 18 through a venturi 22 mounted along center axis 17 and past an opening 23 in the center of cover 21. Opening 23 can be any appropriate size and, in one embodiment, can range from approximately ½" to 2 and ⅞" in diameter. The resultant flow of gases creates a Bernoulli effect and causes a pressure gradient to form from the outer circumferences of cover 21 and susceptor 13 to opening 23. The Bernoulli effect draws the process gases into the channel formed between cover 21 and susceptor 13 and across wafers 14 mounted on susceptor 13. An epitaxial layer is then formed as the process gases flow across and deposit onto wafers 14. Remaining process gases are re-introduced into reactor chamber 18 through opening 23 or are removed via one or more exit ducts 19. The arrows in FIG. 2 indicate typical gas flows. Therefore, by utilizing the Bernoulli effect, the pressure drop from the circumference to the center can be controlled by controlling the flow rate of gases from venturi 22 into reactor chamber 18, thereby allowing the growth rate of epitaxial layers on the silicon wafers to be controlled.

Cover 21 also aids in reducing slip by minimizing temperature gradients along the top and bottom surfaces of wafers 14. Due to its composition and close proximity to susceptor 13, cover 21 reduces heat loss from the top surfaces of wafers 14 by reflecting and radiating heat back onto the top surfaces. Cover 21 can be of any appropriate thickness, preferably in the range of ¼" to 1" thick. A thinner cover is easier to handle and cheaper to make. However, a thicker cover has more thermal mass and thus will hold more heat for radiating back onto the wafer tops.

Reflected energy from cover 21 also contributes to heating the tops of wafers 14. The amount of reflected heat depends on the distance from cover 21 to susceptor 13 or wafers 14. The closer the distance, the more heat is reflected and the better the wafer temperatures are controlled. However, by decreasing the distance, less process gases can flow through the channel and deposit on the wafers, which may result in a non-uniform epitaxial thickness on the wafers. Accordingly, there is a tradeoff between thickness uniformity and minimizing temperature gradients on the wafer surfaces. In the present invention, the distance from cover 21 to wafers 14 can vary from ¼" to 2". In other embodiments, heat or light sources can be used to actively heat cover 21 to more closely approximate a black body cavity formed within cover 21 and susceptor 13. As a result, the cover thickness and the cover-to-wafer distance are much less critical parameters in the reactor design. However, with the increased temperature control on the top surfaces of the wafers and corresponding slip reduction, comes the added complexity and cost of another heat source.

Susceptor 13, in a typical batch reactor, is 24" in diameter and will hold 21 five-inch wafers, 15 six-inch wafers, 8 eight-inch wafers, or 4 twelve-inch wafers. This invention makes possible the formation of epitaxial layers on the surfaces of the wafers with substantially greater uniformity and substantially reduced slip compared to the prior art batch reactors, in particular the batch reactor shown, for example, in U.S. Pat. No. 4,632,058 to Dixon et al. cited above.

The above-described embodiments of the present invention are merely meant to be illustrative and not limiting. It will thus be obvious to those skilled in the art that various changes and modifications may be made without departing from this invention and its broader aspects. Therefore, the appended claims encompass all such changes and modifications as fall within the true spirit and scope of this invention.

What is claimed is:

1. A reactor, having a bottom portion, for the growth of epitaxial layers on wafers which comprises:
   a susceptor having a top surface for holding wafers, wherein the susceptor and the wafers are approximately parallel to the bottom portion of the reactor, and
   a cover located directly above said susceptor for reflecting and radiating heat back onto any wafers mounted on said susceptor thereby to control the temperature gradient across the wafers to be less than a selected amount.

2. A reactor for the growth of epitaxial layers on wafers which comprises:
   a susceptor having a top surface for holding wafers; and
   a cover above said susceptor for reflecting and radiating heat back onto any wafers mounted on said susceptor thereby to control the temperature gradient across the wafers to be less than a selected amount, wherein said cover comprises silicon carbide.

3. The reactor of claim 2 wherein said cover further comprises a graphite material coated with said silicon carbide.

4. The reactor of claim 1 wherein said cover includes an opening formed in the center of said cover to allow gases to pass through said opening.

5. The reactor of claim 4 wherein said opening is approximately ½ to 2 and ⅞ inches in diameter.

6. The reactor of claim 1 wherein said cover is approximately ¼ to 1 inches thick.

7. The reactor of claim 1 wherein the bottom surface of said cover is approximately ¼ to 2 inches above said wafers.

8. The reactor of claim 6 wherein said cover is approximately ¼ to 2 inches above said wafers.

9. A reactor for the growth of epitaxial layers on wafers which comprises:

a susceptor having a top surface for holding wafers;

a cover above said susceptor for reflecting and radiating heat back onto any wafers mounted on said susceptor thereby to control the temperature gradient across the wafers to be less than a selected amount; and a venturi for injecting process gases into said reactor, said venturi injecting the gases vertically along the center line of said reactor through an opening in the cover.

10. The reactor of claim 9 wherein said venturi is adapted for the injection of a carrier gas and a silicon-containing gas.

11. The reactor claim 9 wherein said venturi is adapted for the injection of selected gases for the formation of selected layers for use in fabricating semiconductor devices.

12. The reactor of claim 1 further comprising heat sources for actively heating said cover.

13. A method of reducing slip in wafers on a susceptor during epitaxial growth in a reactor having a bottom portion comprising the step of placing a cover directly above said wafers on a susceptor, said cover being adapted to reflect and radiate heat back onto the top surfaces of said wafers, wherein said susceptor and said wafers are approximately parallel with said bottom portion of said reactor.

14. The method of claim 13 further comprising the step of actively heating said cover.

15. The method of claim 13 further comprising the step of injecting gases through an opening in said cover to create a Bernoulli effect to draw said gases across the top surfaces of said wafers.

16. The method of claim 15 wherein said gases are injected at a selected flow rate to control the flow rate of said gases over the top surfaces of said wafers.

* * * * *